United States Patent
Atwal et al.

(10) Patent No.: US 8,576,599 B2
(45) Date of Patent: Nov. 5, 2013

(54) MULTI-WAFER 3D CAM CELL

(75) Inventors: Jagreet S. Atwal, Carrboro, NC (US);
Joseph S. Barnes, Chapel Hill, NC (US); Kerry Bernstein, Underhill, VT (US); Robert J. Bucki, Cary, NC (US); Jason A. Cox, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 13/364,607

(22) Filed: Feb. 2, 2012

(65) Prior Publication Data

US 2012/0127771 A1   May 24, 2012

Related U.S. Application Data

(62) Division of application No. 11/750,676, filed on May 18, 2007, now abandoned.

(51) Int. Cl.
*G11C 15/00* (2006.01)
*G11C 5/14* (2006.01)

(52) U.S. Cl.
USPC .................. 365/49.1; 365/49.11; 365/49.17; 365/226

(58) Field of Classification Search
USPC .................... 365/49.1, 49.11, 49.17
See application file for complete search history.

(56) References Cited

U.S. PATENT DOCUMENTS

| | | | |
|---|---|---|---|
| 4,398,248 A | 8/1983 | Hsia et al. | |
| 6,467,092 B1 * | 10/2002 | Geile et al. | 725/131 |
| 6,490,571 B1 | 12/2002 | Cooper | |
| 6,551,857 B2 | 4/2003 | Leedy | |
| 6,600,173 B2 | 7/2003 | Tiwari | |
| 6,707,718 B1 | 3/2004 | Halim et al. | |
| 7,117,301 B1 | 10/2006 | James et al. | |
| 2002/0020862 A1 | 2/2002 | Livengood et al. | |
| 2002/0025604 A1 | 2/2002 | Tiwari | |
| 2002/0196683 A1 | 12/2002 | Ohtani et al. | |
| 2003/0129829 A1 | 7/2003 | Greenlaw | |
| 2003/0134481 A1 | 7/2003 | Fallica | |
| 2003/0156440 A1 * | 8/2003 | Hata et al. | 365/49 |
| 2004/0114411 A1 | 6/2004 | Noda et al. | |
| 2005/0023656 A1 | 2/2005 | Leedy | |
| 2005/0067620 A1 | 3/2005 | Chan et al. | |
| 2006/0033110 A1 | 2/2006 | Alam et al. | |
| 2007/0177419 A1 | 8/2007 | Sachdev et al. | |
| 2008/0283995 A1 | 11/2008 | Bucki et al. | |

* cited by examiner

*Primary Examiner* — Ly D Pham
(74) *Attorney, Agent, or Firm* — Scully, Scott, Murphy & Presser, P.C.; Vazken Alexanian (57) ABSTRACT

A multi-wafer CAM cell in which the negative effects of increased travel distance have been substantially reduced is provided. The multi-wafer CAM cell is achieved in the present invention by utilizing three-dimensional integration in which multiple active circuit layers are vertically stack and vertically aligned interconnects are employed to connect a device from one of the stacked layers to another device in another stack layer. By vertically stacking multiple active circuit layers with vertically aligned interconnects, each compare port of the inventive CAM cell can be implemented on a separate layer above or below the primary data storage cell. This allows the multi-wafer CAM structure to be implemented within the same area footprint as a standard Random Access Memory (RAM) cell, minimizing data access and match compare delays.

7 Claims, 8 Drawing Sheets

MULTI-WAFER 3D CAM CELL

CROSS REFERENCE TO RELATED APPLICATION

This application is a divisional of U.S. patent application Ser. No. 11/750,676, filed May 18, 2007 the entire content and disclosure of which is incorporated herein by reference.

FIELD OF THE INVENTION

The present invention relates to a semiconductor structure and a method of fabricating the same. More particularly, the present invention relates to a Content Addressable Memory (CAM) cell in which a compare port of the CAM cell is located in a separate wafer vertically abutting another wafer including the CAM cell's core latch, e.g., storage element. The present invention also provides a method of forming such a CAM cell in which three-dimensional (3D) integration is employed in forming the same.

BACKGROUND OF THE INVENTION

Nearly every modern microprocessor employs a cache whereby some instructions and/or data are kept in storage that is physically closer and more quickly accessible than from the main memory. This type of storage is commonly known as a cache. When the cache is tightly integrated into the processor's execution pipeline, it's called an L1 (e.g., Level 1) cache.

Figure 1:
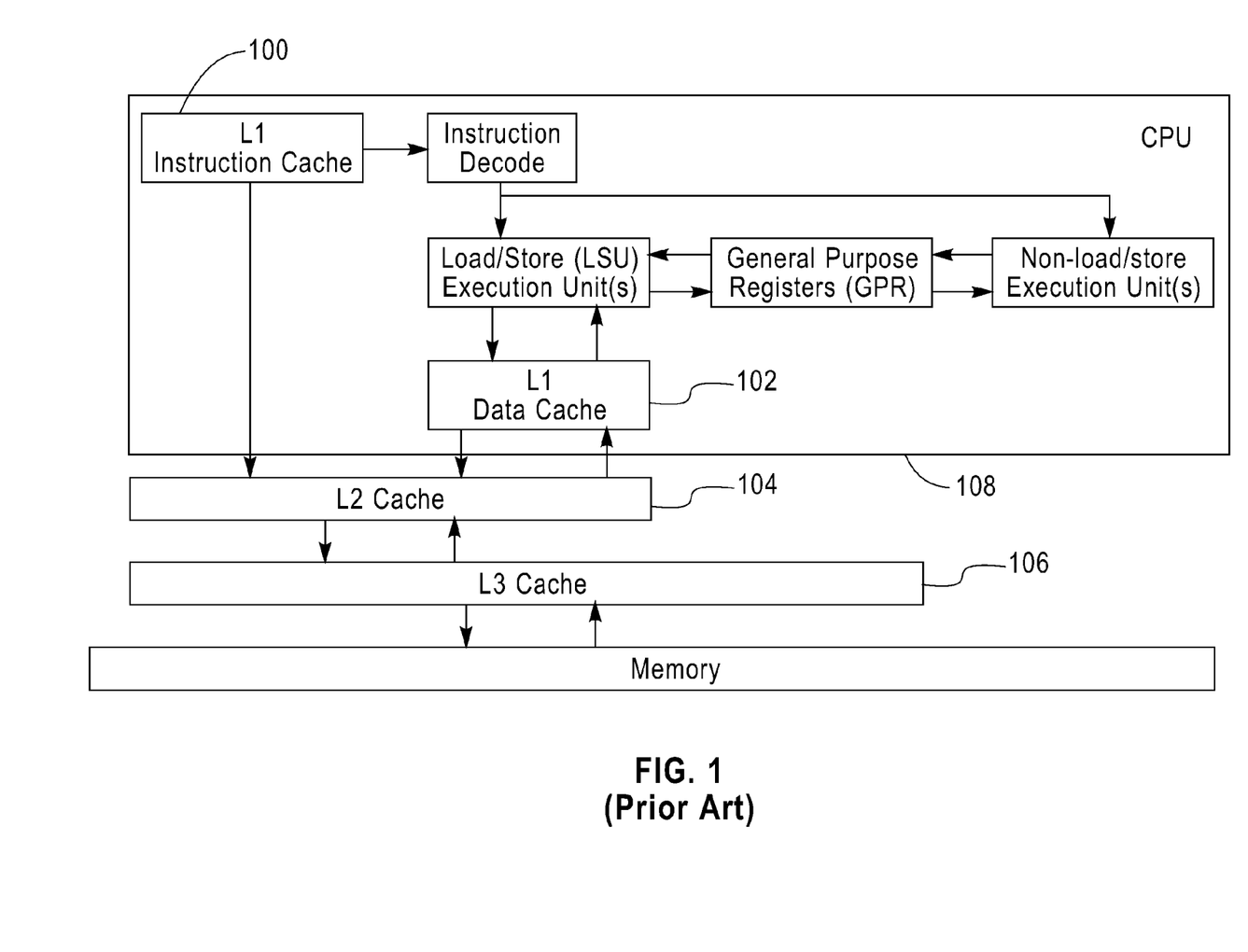
FIG. 1 is a system-level representation of a prior art microprocessor 108 (e.g., CPU) and its connection to a memory subsystem.

FIG. 1 shows a system-level representation of a prior art microprocessor 108 (e.g., CPU) and its connection to a memory subsystem. In this example, the microprocessor includes an L1 instruction cache 100 and an L1 data cache 102. The system also includes an L2 cache 104 that holds both instructions and data as well as an L3 cache 106 that backs up the L2 cache 104.

Microprocessor performance is tied very closely to the access time of the L1 data cache. In fact, this is of such importance that the access time of the L1 data cache 102 plays a central role in determining the microprocessor frequency target. One of the "tricks" sometimes employed by logic designers to improve L1 data cache 102 access time is to use a CAM-based approach instead of the more traditional directory-based approach, which is typically used in L2 cache 104 designs.

Figure 2:
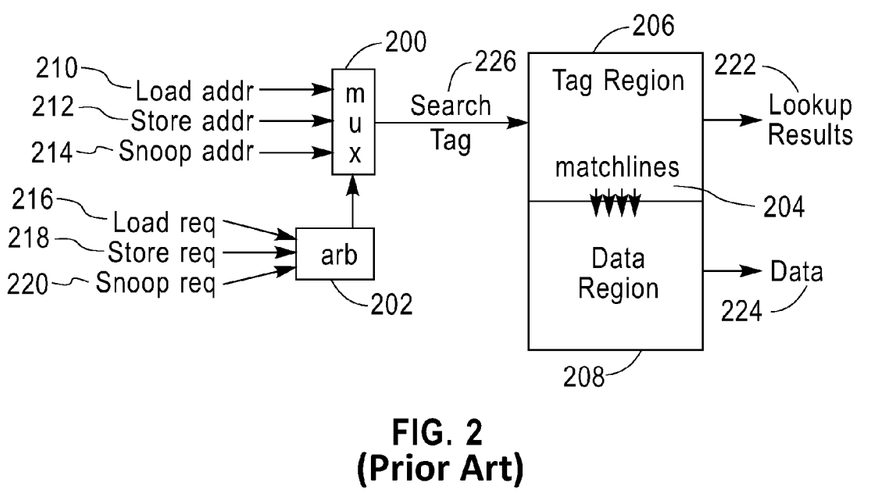
FIG. 2 is a block diagram representation of a prior art CAM-based L1 data cache.

FIG. 2 is a block representation of a CAM-based L1 data cache. Rather than having a separated directory plus data arrays as in a traditional directory-based approach, in a CAM-based L1 data cache, the directory and the data array are designed to work as a single structure. The CAM (Content Addressable Memory) has a tag region 206 that keeps the addresses of all of the lines in the cache and a data region 208 that keeps the data for all of the lines in the cache.

In a directory-based cache, the microprocessor searches the cache by selecting a few lines in the directory (typically 1-8 lines) to read and then sends them thru comparators to determine whether there's a "hit". In some implementations, the comparator results form part of the address used to read from a separate data array. In other implementations, the data array reads all of the possible "hit" locations concurrently with the directory read-compare operation and then uses the "hit" results to select which data is actually being requested by the microprocessor.

In a CAM-based cache, the microprocessor searches the cache by comparing the search tag 226 vs. all of the cache's valid tags at once and then using the compare results (match lines 204) as a decoded address into the data region 208 for the read. Only the data that's desired is read out 224, and there is no multiplexer after the data region read that's waiting on the directory hit results. The match lines 204 also go through a reduction OR to produce the lookup results 222 that indicate whether the search found a hit or was a miss.

There are several operations within the microprocessor that require a tag search on the L1 data cache. A load operation wants to read data from memory and place it into a register. As the load is executed, it first makes a load request 216 to the cache control arbiter 202 to perform an L1 data cache lookup. A lookup is defined as a tag search plus data read if a tag match is found. A load request 216 has an associated load address 210 that's used to form the search tag 226 for the load. A store operation wants to write data to memory. As the store is executed, it first makes a store request 218 to the cache control arbiter 202 to perform an L1 data cache search. A store request 218 has an associated store address 212 that's used to form the search tag 226 for the store. If there is a hit, the store requestor is informed of the location of the hit so that it knows where in the cache to write the store's data or whether to send the store request to the L2 cache 104 or to the memory. A snoop operation wants to know whether a line is in the cache, sometimes for the purpose of invalidating the line from the cache. As the snoop is executed, it first makes a snoop request 220 to the cache control arbiter 202 in order to perform an L1 data cache search. A snoop request 220 has an associated snoop address 214 that's used to form the search tag 226 for the snoop. If there is a hit, the snoop requestor is informed of the location of the hit so that it knows which tag to invalidate if it needs to do so.

It would be beneficial to create a multi-layer CAM structure where the compare results are available faster. The CAM Search and Lookup operations selecting the data tend to be the frequency limiting paths in microprocessors. Improving these paths is likely to improve the overall frequency expectation for the processor. Additionally, any improvement in these paths may enable other cache control functions to be processed in the same cycle. For example, if a cache search for a snoop request 220 could be processed more quickly the resource dedicated to servicing the snoop requestor can be freed earlier. Freeing resources like these more quickly allows for increased bandwidth with the same number of resources or possibly the same bandwidth with a smaller number of resources. This provides additional area and power savings.

Conventional CAM designs require the compare and tag storage to be turned on every time the CAM is accessed. However, if the compare logic was put on a separate layer, it would be possible to power it down separately from the data portion. In a sleep mode, it would be desirable to maintain the data in the CAM structure while disabling the compare portion to save power. Also, if a warning indicator arrived before operations that were to access the CAM it would be possible to disable the compares when it was known that they would not be needed for some period of time.

CAM designs are used for structures other than caches. Any widely associative searchable structure may employ a CAM structure. For example, a buffer which holds stores bound for a cache might need to be searchable. A CAM structure would be helpful if stores needed to be located for invalidation (snoops) or hazard comparisons (load hit store, store-to-load forwarding).

Figure 3:
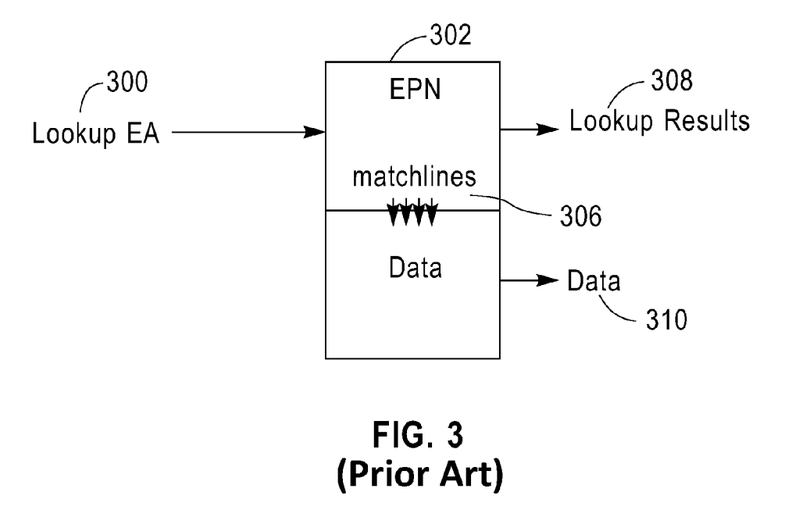
FIG. 3 is a pictorial representation (through a cross sectional view) of a prior art CAM µTLB Access Cell.

Many processors employ small cache-like structures close to the Instruction or Data Cache to do address translation. These structures are commonly called μTLB's (micro Translation Look-aside Buffer) or ERAT's (Effective to Real Address Translator). A µTLB (See, FIG. 3) contains a subset of a larger page translation table. Typically these structures are accessed using an Effective Address 300 (EA) and comparing that with an Effective Page Number 302 (EPN). Using a CAM structure for this function, the EA 300 would be used as the search value, and the EPN 302 would be the value held and compared internally in the CAM structure. The data needed for translating the page would be contained in the data portion 304 of the structure and would be indexed by the CAM's matchlines 306. The CAM would provide the results of the lookup 308 as well as the matchlines 306. The data structure would then provide the data needed 310 to translate the address.

In view of the above, there is a need for providing a new and improved CAM cell in which the compare results can be obtainable faster, without increasing the distance that the signals need to travel.

SUMMARY OF THE INVENTION

The present invention provides a multi-wafer CAM cell in which the negative effects of increased travel distance have been substantially reduced. This is achieved in the present invention by utilizing three-dimensional integration in which multiple active circuit layers are vertically stacked and vertically aligned interconnects are employed to connect a device from one of the stacked layers to another device in another stacked layer.

By vertically stacking multiple active circuit layers with vertically aligned interconnects, each compare element of the CAM cell can be implemented on a separate layer above or below the primary data storage cell. This allows the CAM structure to be implemented within the same area footprint as a standard Random Access Memory (RAM) cell, minimizing data access and match compare delays. Each compare match line and data bit line has the length associated with a simple two-dimensional Static Random Access Memory (SRAM) cell array.

The inventive three-dimensional approach allows the interconnect delays of match lines and bit lines for a multi-wafer CAM to be comparable to those associated with the bit lines of a conventional two-dimensional RAM array. The match line access is improved over the standard 2D approach for single and multi-wafer CAM arrays. The base RAM layer can be identical to standard SRAM, eliminating the need for additional reticle enhancement techniques to be developed for a CAM cell.

In general terms, the present invention provides a multi-wafer CAM comprising:

at least one compare element (or circuitry) located in a first structure which is vertically stacked on top of or below, preferably on top of, at least one storage element (circuitry) located in a second structure, said at least one compare element and said at least one storage element are present in separate wafers and are interconnected by at least one vertically conductive filled via hole.

In a preferred embodiment of the present invention, the at least one compare element is located above the at least one storage element.

The at least one compare element comprises a plurality of first field effect transistors that typically have a 9T configuration and the at least one storage element comprises a plurality of second transistors typically having a 6T configuration. The plurality of first transistors are located upon and within a top, active semiconductor layer of a first semiconductor-on-insulator substrate, while the plurality of second transistors are located upon and within a top, active semiconductor layer of a second semiconductor-on-insulator substrate. The first and second semiconductor-on-insulator substrates each include a buried insulating layer directly beneath the top, active semiconductor layer.

In one preferred embodiment, a multi-wafer CAM cell is provided that includes:

at least one compare element including a plurality of first transistors arranged in a 9T configuration located in a first structure which is vertically stacked on top of at least one storage element including a plurality of second transistors arranged in a 6T configuration located in a second structure, said at least one compare element and said at least one storage element are present in separate wafers and are interconnected by at least one vertically conductive filled via hole.

In addition to the above, the present invention also provides a method of fabricating the inventive multi-wafer CAM cell. The inventive method which includes 3D integration and wafer bonding includes the steps of:

providing a first structure including a plurality of first transistors located upon and within a surface of a first active semiconductor layer;

providing a second structure including a plurality of second transistors located upon and within a surface of a second active semiconductor layer;

bonding a surface of said second structure to a surface of said first structure to provide a bonded structure in which the plurality of first transistors are located above the plurality of second transistors; and forming at least one vertically filled conductive via to connect said plurality of first transistors to said plurality of second transistors.

DETAILED DESCRIPTION OF THE INVENTION

The present invention, which provides a compact multi-wafer CAM cell and a method of fabricating the same, will now be described in greater detail by referring to the following discussion and drawings that accompany the present application. It is noted that the drawings are provided for illustrative purposes only. As such, the drawings included within the present application are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 4:
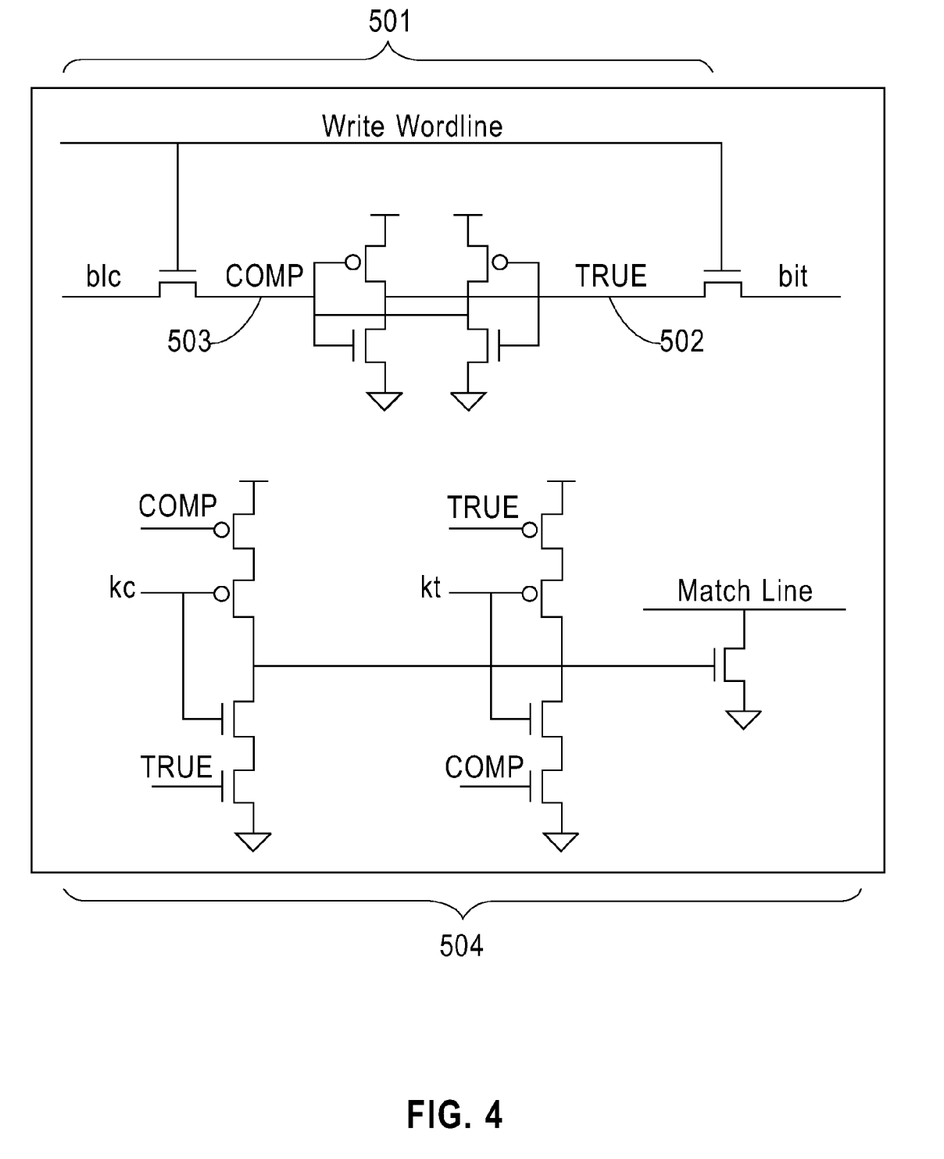
FIG. 4 is a pictorial representation (through a cross sectional view) illustrating two pieces that comprises a CAM cell.

Reference is first made to FIG. 4 which shows two pieces that comprise a single port CAM cell. The top six transistors 501 show the standard 6T cell where storage nodes (compa 503 & true 502) are comprised of two inverters and access to it is controlled using NFET pass gates. The bottom nine transistors (e.g., 9T) 504 show the compare circuitry and the NFET used to drive the match line.

On a single wafer design fabricated using 2D integration, these elements would be all laid out together. So the area footprint would be that of 6T area plus the area of 9T (compare circuitry). In the present invention, these two elements are split, placing the 6T storage cell on one wafer, and the 9T (compare circuitry) on another wafer. As is apparent in the circuit schematics in FIG. 4, the 6T storage cell is a complementary metal oxide semiconductor (CMOS) circuit including p-type field effect transistors (pFETs) and n-type field effect transistors (nFETs). The 9T compare circuitry is another complementary CMOS circuit including pFETs and nFETs. The logic, compare data ins and match lines out are implemented on the wafer including the compare element. Storage nodes (e.g., labeled true and comp) are connected vertically through vias to the compare circuits above. An excessive load on the storage nodes can impair write ability. A true/complement generator buffer can be inserted in a layer above the storage cell to isolate the load of multiple compare devices from the storage nodes.

Figure 5A:
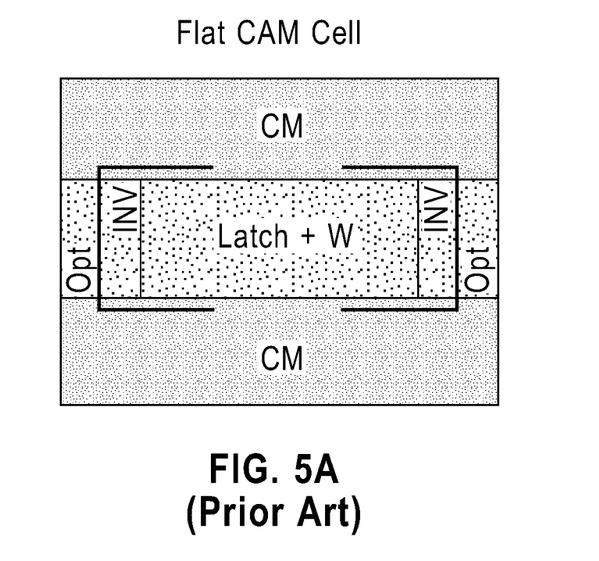
FIGS. 5A-5B are pictorial representations illustrating a prior art 2D CAM cell design and the inventive CAM cell design, respectively.
Figure 5B:
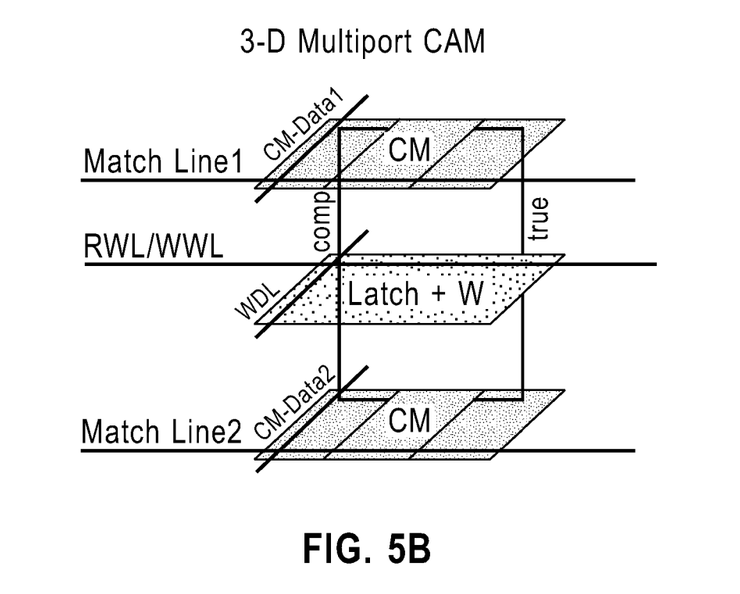

The resulting footprint would consist of the larger of two elements i.e., the 9T circuitry plus added area of vertical integrated nodes (true & complement). FIGS. 5A and 5B respectively show this above differentiation in graphical view. FIG. 5A is the prior art design, while FIG. 5B is the inventive design. In FIG. 5A basic cell parts and connections are shown for a 2D cell with standard metal interconnects. The "Latch+W" block represents the memory latch circuitry of the cell and the write port circuitry of the cell to that memory latch. The two "CM" blocks represent two CAM port circuits. The line on the left represents the complementary node of the latch cell going to the CAMs while the line on the right is the TRUE node. Also, shown in FIG. 5A are two optional inverter circuits,".opt INV", for driving the comp and true nodes to the "CM" circuits. FIG. 5B shows the inventive design basic parts of a CAM cell in a 3D interconnect environment. Labeling is the same as in FIG. 5A. The "comp" and "true" signals from the memory cell latch is passed via a vertical interconnect, rather than a horizontal metal interconnect. "RWL/WWL" labels the Read Wordline select for the read port and the write Wordline select for the write port to control the write to the cell. "Match Line1" and Match Line2" label the outputs of the "CM" CAM circuits to indicate when the data latched in the "Latch" part of the cell matches the compare data provided to the cell on "CM-Data 1" and "CM-data 2" respectively.

One can observe that the overall footprint area (bird's eye view) is much less in FIG. 5B than in FIG. 5A. Smaller area of the resultant CAM cell has many benefits including, for example, shorter bit lines (write and read data), shorter match data lines, and shorter match lines, shorter word lines (write and read).

All of these benefits result in a CAM structure that is easier (faster) to write, and a marked improvement in CAM search because of shorter match data line and match lines. This aspect of the present invention is now described in further detail.

Figure 6:
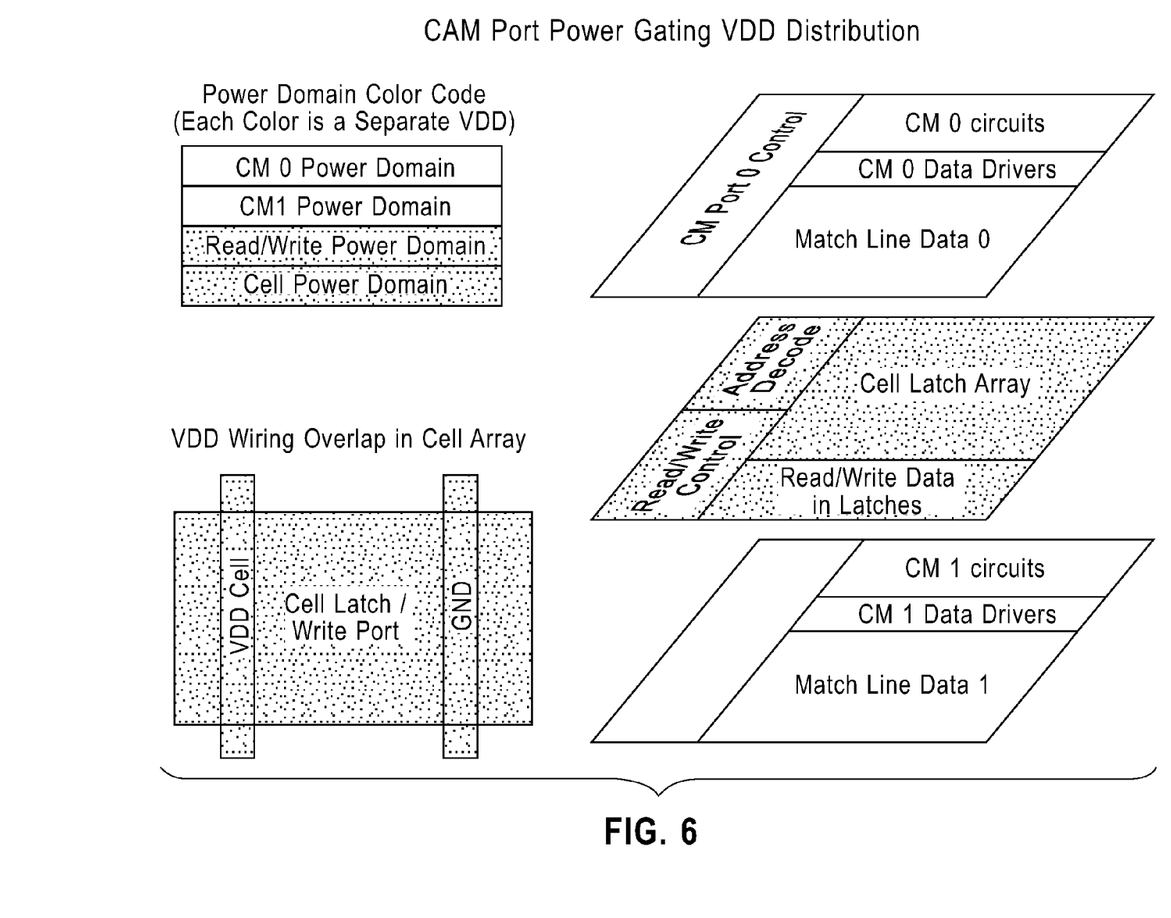
FIG. 6 is a schematic illustrating the power distribution on the inventive multi-wafer CAM cell, where the wafer with the 9T (match circuitry) also includes the control logic for the match line, match data drivers and all the clocking and where the other wafer includes the 6T (storage node), read and write control logic, write data drivers and read scheme.

On a single wafer the CAM (6T+9T) circuits are so closely laid out, that it is almost impossible to give separate voltage domains to these elements without significantly increasing the area footprint, and also leads to added complexity for power distribution and the access area for power wires. FIG. 6 shows the power distribution on the inventive multi-wafer CAM cell, where wafer with 9T (match circuitry) also includes the control logic for match line, match data line drivers and all the clocking; likewise on the other wafer included are 6T (storage node), read and write control logic, write data drives and read scheme.

In the inventive multi-wafer CAM cell, the 6T and 9T lie physically on a separate wafer, where controlling power distribution could be done on a wafer to wafer basis; i.e., it is possible to have match circuitry and storage circuitry with lower or higher voltages with respect to each other. For example, the 6T can be physically in one wafer and the 9T can be physically in another wafer. One wafer may include a first CMOS structure such as the first structure 10' in FIGS. 8A-8D, which includes a match circuitry and is configured to have a power supply voltage provided through a power distribution structure. The other wafer can include a second CMOS structure such as the second structure 34 in FIGS. 8C and 8D. The second CMOS structure can include a storage circuitry that is configured to have a different power supply voltage provided through another power distribution structure. As discussed above, the match circuitry can include at least one compare element, and the storage circuitry can have at least one storage element. The at least one dielectric material 24 and the conductive filled openings 26, which are illustrated in FIGS. 8A-8D, represent an interconnect structure (or wiring structure), which inherently includes a power distribution structure required to power the match circuitry. This power distribution structure is herein referred to as a first power distribution structure. The first power distribution structure includes first power wires (which are a subset of the conductive filled openings 26) that are located in the at least one dielectric material 24 (See FIGS. 8A-8D), which is herein referred to as a first dielectric material layer. The match circuitry can be powered by a first power supply voltage provided by the first power distribution structure. Further, the second structure 34 can include at least one dielectric material 46 and conductive filled openings 48 as illustrated in FIGS. 8C and 8D. The second structure 34 is a wiring structure, which inherently includes another power distribution structure required to power the storage circuitry. This power distribution structure is herein referred to as a second power distribution structure. The second power distribution structure includes second power wires (which are a subset of the conductive filled openings 48) that are located in the at least one dielectric material 46 (See FIGS. 8C-8D), which is herein referred to as a second dielectric material layer. The storage circuitry can be powered by a second power supply voltage provided by the second power distribution structure. The match circuitry and the storage circuitry are interconnected by at least one vertically conductive filled via hole 52 as illustrated in FIG. 8D. The first power supply voltage and the second power supply voltage are different from each other. Because the first power supply voltage and the second power supply voltage are different, the first power distribution structure located within the first dielectric layer, i.e., the at least one dielectric material 24, does not contact the second power distribution structure located within the second dielectric layer, i.e., within the at least one second dielectric 46. Timing critical paths could easily be supplied with a higher lower, or vice versa non critical circuits (higher margin) could be given a lower voltage. There may be a need of a voltage translator if storage cell is on a lower voltage than compare circuits, since true and complement lines are driven from the storage cell to the compare circuitry. Separation of 6T (cell) and 9T (compare) onto different wafers also allows for more granular power gating.

Another advantage of the inventive CAM cell is that it can completely turnoff the match circuitry, when architecturally match circuits are not being utilized, and the storage node core can be used as a standard register. The inventive CAM cell leaves flexibility for more innovative architectural solutions.

The actual area and timing differences between single wafer CAM (prior art) vs. multi-wafer CAM designs (present invention) will now be discussed.

Figure 7A:
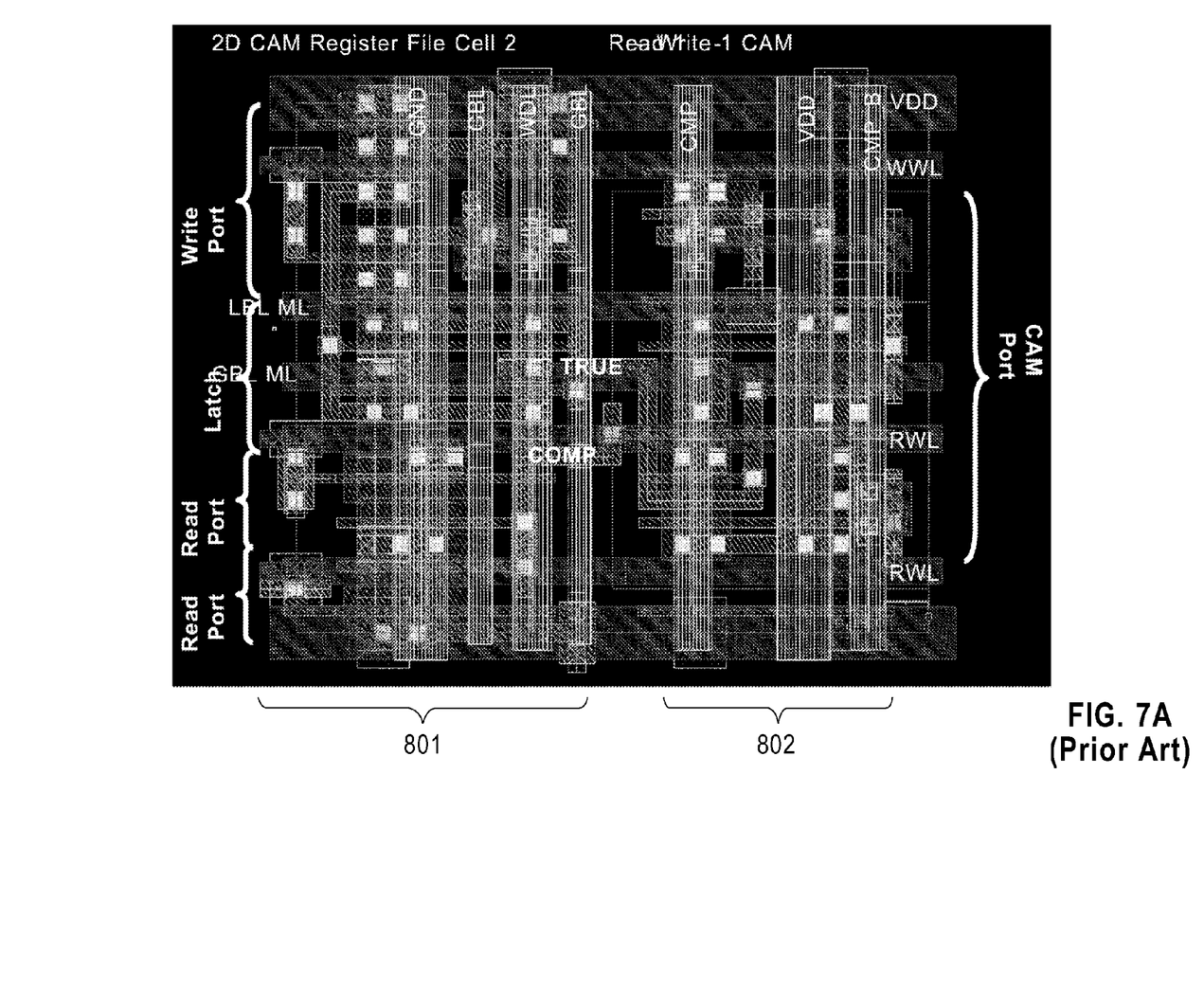
FIG. 7A shows a prior art design layout of a 2 read, 1 write and a CAM (9T) cell.
Figure 7B:
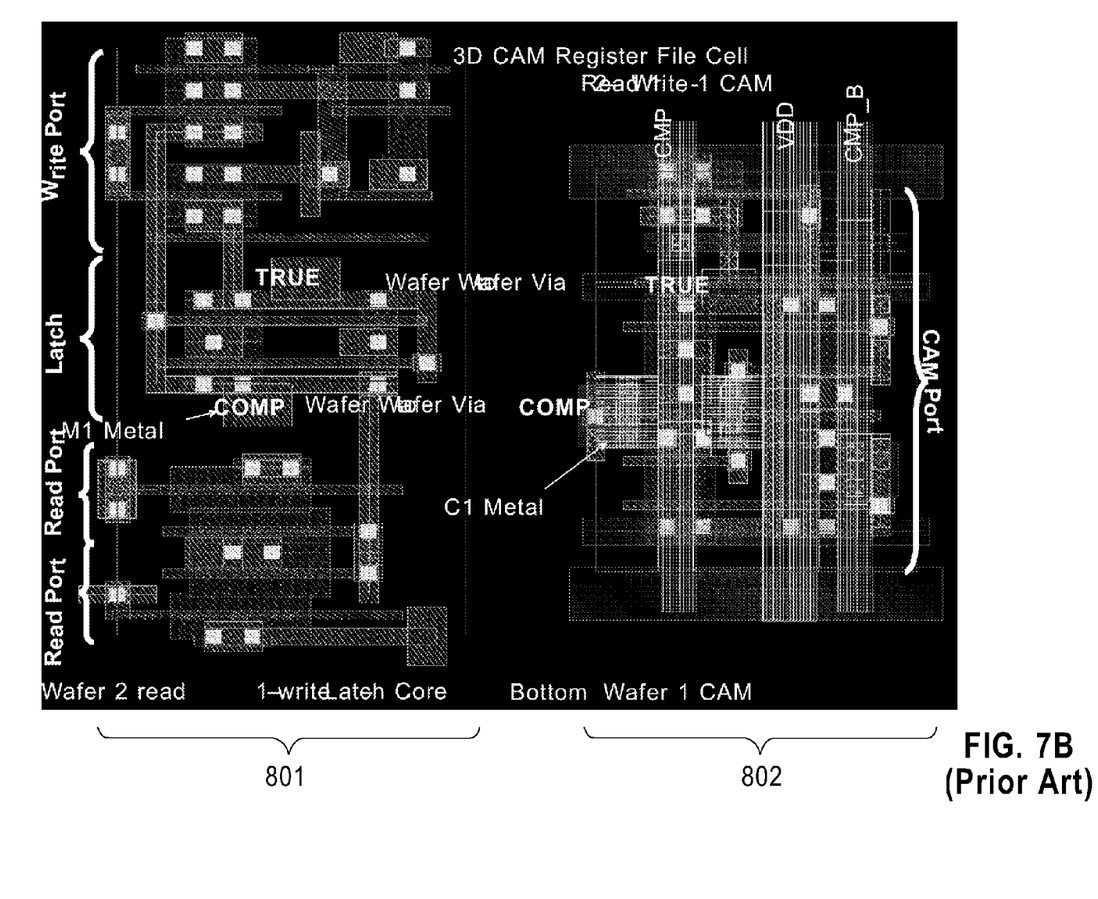
FIG. 7B shows the design layout of the inventive multi-wafer CAM cell. On the left is shown the 2 read, 1 write and storage node, and on the right is the 9T (compare) circuitry.

FIG. 7A shows the layout of a 2 read, 1 write and a CAM (9T) cell. This cell is also referred herein as a 2r1w1c cell. This 2r1w1c cell represented here is a register file CAM cell drawn out in 45 nm technology. In this layout, all elements (read, write, storage node, CAM) are densely integrated. The dimensions of this dense layout are 2.736 μm (width), and 2.28 μm (h). FIG. 7A shows a prior art 2D CAM 2r1w1c register file cell. The 2 read ports, 1 write port and memory cell latch circuits are located on the left half of the cell and are labeled in the picture to show there veridical position. The CAM port circuit occupies the left half of the cell and is labeled "CAM port". Important signals are also labeled. "RWL"—Read Wordline, "WWL" write Wordline, "Gbl"—Global Bit line, VDD/GND, "CMP"—True Compare data to CAM, "CMP_B"—complementary compare data to CAM. It is Important to note the connectivity of internal cell nodes of the "TRUE" and "COMP" wires of the cell to the CAM port on Horizontal metal level 1 interconnect. In FIG. 6B the "TRUE" and "COMP" signals connect up a layer through vertical interconnect vias labeled as "wafer-to-wafer via". FIG. 7B is the inventive layout. The CAM port in FIG. 7B is located on a separate layer place under a wafer layer that contains the 2 read ports, write port and latch of the cell. By under, the top metal of lower wafer is the nearest layer to the substrate of the upper wafer layer.

FIG. 7B shows the two pieces of the layout; on the left is the 2 read, 1 write and storage node 801; on the right is the 9T (compare) circuitry 802. The latch core is the constructed on the top wafer, the CAM is laid out on the bottom wafer, and these two elements are connected together with the true and comp nodes using vertical interconnects. The connection to the latch core is made at the M1 metal level and on the bottom wafer the connection to the CAM is made at the C1 (M4) metal. M1 is the lowest metal data could be driven out of the storage cell, and C1 is the highest metal being used in the CAM. This way vertical interconnect distance is kept at a minimum, whereby reducing the overall capacitance and resistance. The dimensions of the storage cell are 1.368 μm (width), and 2.66 μm (height); and the dimensions of the CAM circuitry is 1.368 μm (width) and 1.52 μm (height). As one can see the latch core (storage cell) circuitry has a larger footprint than the CAM, so the latch core area will dictate the overall dimensions of the array. However, additional CAM ports can be added vertically to the 3D stack without an increased 2D footprint. In actuality, a single wafer multi-port CAM implementation would likely be larger than the sum of the areas of the latch core and the compare circuits in order to accommodate wiring for the additional compare ports.

The heights of the dense CAM cell (2.52 μm) and latch node (2.66 μm) in this modular 2r1w1c are similar, so one would NOT realize any improvements in vertically timed paths. Some of these vertically timed paths are 1. Read: local bit line readout, local receiver, global bit line readout 2. Write data arrival time 3. Match Data Arrival Time. The delay through these paths would remain the same because of NO reduction in height by going to 3D integrated cell.

However, now comparing the widths 2.736 μm for the dense arrays vs. 1.368 μm in the 3D integrated array (per bit cell column), one observes that the width is half of its original size. The reduced width has many timing benefits including, for example:

Read word line propagation delay is reduced
  a. For a 32 bit array in 45 nm technology with wire 1.5× spacing and 1.5 width, one would see approximately 2-3 pico seconds (ps) improvement in read word line propagation delay.

Write word line propagation delay is reduced
  a. More margin in cell write ability if the write data arrives before the word line
  b. For a 32 bit array in 45 nm technology with wire 1.5× spacing and 1.5 width, one would see approximately 2-3 Pico seconds improvement in write word line propagation delay Match Line delay improvement
  a. For a 32 bit array in single wafer, CAM search takes 129 ps, breakdown of this 48 ps are taken for compare (true & comp) data launch, and other 81 ps are taken in the propagation of match line through local and global scheme and latching into cross-coupled nand. This delay degrades with each additional single wafer compare port. For a single wafer 3-port CAM implementation, match line propagation is 108 ps, with a CAM search time of 156 ps.
  b. For a 32 bit array in multi-wafer, CAM search takes 118 ps, breakdown of this 48 ps are taken for compare (tru & comp) data launch, and other 70 ps are taken in the propagation of match line through local and global scheme and latching into cross-coupled nand.

Since the height remains approximately the same (2.66 μm vs. 2.28 μm), the delay of the match data is the same between both 2-D vs. 3-D CAM arrays. However, the 3-D CAM array sees an improvement of 11 ps in the CAM search, which is an improvement of 8.5% in one of the timing critical paths of the processor. The 3-port CAM array sees an improvement of 38 ps, or 24%.

In order to achieve the multi-wafer CAM cell of the present invention, three-dimensional (3D) integration and packaging technology (also know as vertical integration) is employed. In such a technology, multiple layers of active devices are stacked with vertical interconnection between the layers to form 3D integrated circuits (ICs). 3D ICs provide potential performance advancements even in the absence of continued device scaling, as each transistor in a 3D IC can access a greater number of nearest neighbors and each circuit functional block has higher bandwidth. Other benefits of 3D ICs are improved packing density, noise immunity, improved total power due to reduced wire length and hence lower load capacitance, potential performance benefits, and ability to implement added functionality (mixed technologies).

A preferred embodiment for the fabrication of wafer scale 3D Integration is accomplished via the bonding of independently-fabricated layers of a semiconductor-on-insulator substrate. Each layer is designed and checked as an independent chip with its own metallization layers, but with the addition of vacant vertical via channels for the later placement of the vertical via. Upper layers are all processed to their last metal, and a temporary clear glass handle is glued to the top. The bottom of the wafer is then polished, removing the back silicon, and most of the SOI buried oxide. This wafer is then aligned and then Si-bonded to the top of the base layer using low temperature and pressure bonding. The handle substrate is then removed by either laser-ablating or dissolving the adhesive. The vertical via holes are etched down through the upper layer, reaching the base layer wiring underneath; these vias are then lined and filled in much the same process as a conventional metal via. A final wiring layer is then applied on top of the completed vertical via, and either terminal metals or another silicon layer may be placed on top.

Reference is now made to FIGS. 8A-8D which are pictorial representations illustrating the basic processing steps which are employed in the present invention for fabricating the inventive multi-wafer CAM. In these drawings, two wafers are shown, by way of a preferred example. Although two wafers are used in these drawings the present invention is not limited to utilizing only this number of wafers. In fact, the present invention contemplates cases where pluralities of wafers are stacked one on top of the other utilizing 3D integration.

Figure 8A:
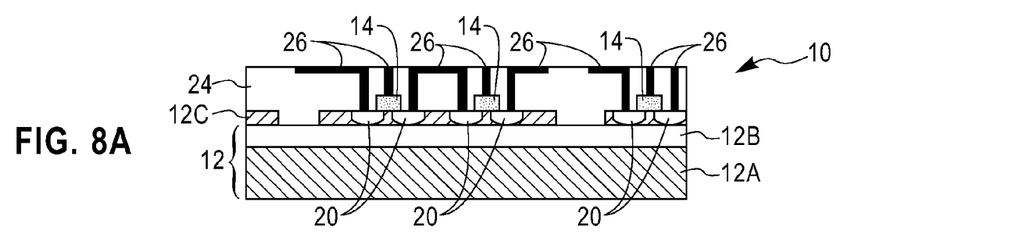
FIGS. 8A-8D are pictorial representations illustrating the basic processing steps that are employed in the present invention in fabricating a compact multi-wafer CAM cell.

Reference is first made to FIG. 8A, which illustrates a first structure (i.e., processed wafer) 10 that can be employed in the present invention. The first structure 10 includes a processed SOI substrate 12 which includes a bottom semiconductor layer 12A, a buried insulating layer 12B and a top, active semiconductor layer 12C. As is shown, the top, active semiconductor layer 12C includes a plurality of semiconductor devices, for example field effect transistors 14 located upon and within the top, active semiconductor layer 12C. Note that the top, active semiconductor layer has been patterned as shown in FIG. 8A.

The top and bottom semiconductor layers 12C and 12A, respectively, comprise any semiconductor material including for example, Si, SiGe, SiC, SiGeC, GaAs, InP, InAs, and multilayers thereof. Preferably, the top and bottom semiconductor layers 12C and 12A, respectively, comprise Si. The buried insulating layer 12B comprises a crystalline or non-crystalline dielectric including oxides, nitrides, oxynitrides and multilayers thereof. Preferably, the buried insulating layer 12B comprises an oxide.

Each transistor 14 includes at least a gate dielectric (such as an oxide) and a gate conductor (such as doped polysilicon or a metal gate). The plurality of transistors may also include at least one sidewall spacer (not shown) and source/drain regions 20 that are located within the top, active semiconductor layer 12C. The SOI substrate, and the components of the transistors are well known to those skilled in the art. Also, methods of making SOI substrates as well field effect transistors are also well known to those skilled in the art. In order not to obscure the invention details concerning the foregoing elements have been omitted.

The structure shown in FIG. 8A also includes at least one dielectric material 24 which includes conductive filled openings 26 (in the form of vias and vias/lines) which extend to the top of the gate conductor as well as the source/drain regions 20. The at least one dielectric material 24 and the conductive filled openings 26 represent an interconnect structure (or wiring structure) that is made using conventional techniques well known in the art. The at least one dielectric material 24 comprises any well known dielectric including, for example, $SiO_2$, silsesquioxanes and C-doped oxides. Porous as well as non-porous dielectric materials can be used. The conductive filled openings 26 comprise a conductive material including, for example, W, Al, Cu and alloys such as AlCu. A liner material such as TiN or TaN may be present in the conductive filled openings 26.

Figure 8B:
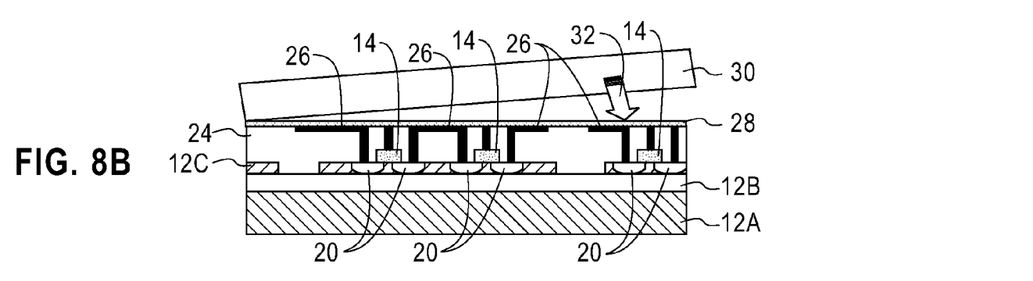
Figure 8C:
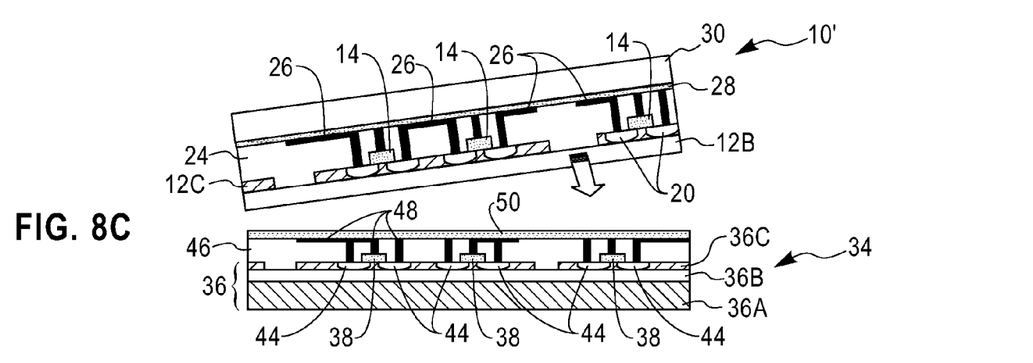
Figure 8D:
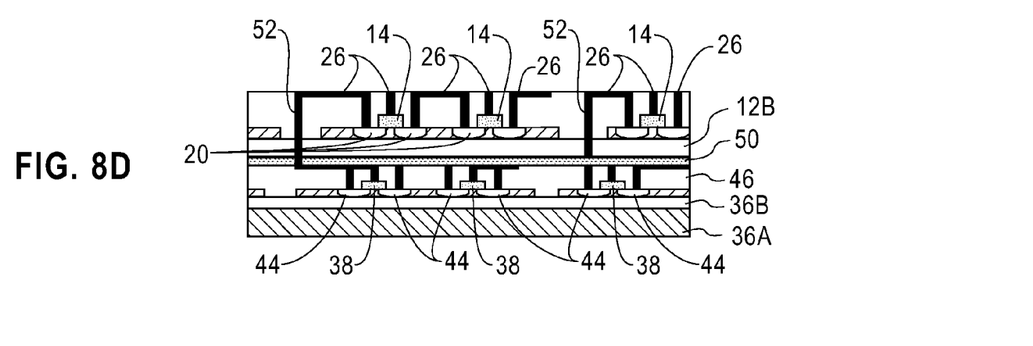

After providing the structure shown in FIG. 8A, an optional adhesive or bonding aid layer 28 is formed on the upper exposed surface of the interconnect structure providing the structure shown in the lower portion of FIG. 8B. The optional adhesive or bonding aid layer 28 comprises, for example, an oxide or a silane. The optional adhesive or bonding aid layer 28 is formed utilizing a conventional deposition process including, for example, chemical vapor deposition (CVD), plasma enhanced chemical vapor deposition (PECVD), or spin-on coating. FIG. 8B also shows the presence of a handling substrate 30 which is brought into contact with the uppermost surface of the structure 10, i.e., either the optional adhesive or bonding layer 28, if presence, or directly to the surface of the dielectric material 24. Arrow 32 indicates the application to the uppermost surface of structure 10.

Next, and as also illustrated in FIG. 8C, the bottom semiconductor layer 12A of the SOI substrate is removed utilizing a planarization process such as chemical mechanical polishing (CMP). During this planarization process, the buried insulating layer 12B is typically thinned from an initial thickness to a first thickness. The structure is now referred to as first structure 10'.

Before, during or after thinning, a second structure (i.e., processed wafer) 34 is formed utilizing standard processing techniques that are well known to those skilled in the art. The second structure 34 includes an SOI substrate 36 which includes a bottom semiconductor layer 36A, a buried insulating layer 36B and a top, active semiconductor layer 36C. Note that the bottom semiconductor layer 36A, the buried insulating layer 36B and the top, active semiconductor layer 36C may comprise the same or different materials as used above for the SOI substrate 12.

The second structure 34 also includes a plurality of field effect transistors 38 that are located upon and within the top, active semiconductor layer 36C. The plurality of transistors 38 of the second structure 34 includes a gate dielectric, a gate conductor, and source/drain regions 44. The second structure 34 also includes at least one dielectric material 46 that includes conductive filled openings 48 that are formed in the at least one dielectric material 46. The at least one dielectric material 46 and the conductive filled openings 48 may comprise the same or different materials as their corresponding elements described above in the first structure. An oxide layer 50 may optionally be formed atop the dielectric material 46 of the second structure.

Next, and as illustrated in FIG. 8C, a desired surface of the second structure 34 is brought into intimate contact with a desired surface of the first structure 10' as is processed in FIG. 8B. Typically, the thinned buried oxide layer 12B of the first structure 10' is brought into intimate contact with the oxide layer 50 of the second structure. Bonding is then performed utilizing any conventional bonding technique known to those skilled in the art. For example, the bonding may be achieved utilizing a nominal room temperature bonding process (temperature from about 20° to about 40° C.) or bonding may be achieved at higher temperatures. Various post bonding anneal processes may be used to enhance the bonding strength.

After bonding the first and second structures 10' and 36 together, the handling substrate 30 is removed by a conventional technique including, for example laser ablation, planarization, or etching. The adhesive or bonding aid layer 28 is typically also removed by this step of the present invention.

Vertical via holes are then formed by lithography and etching down from the now exposed upper surface layer of dielectric material 24 reaching the conductive filled openings 48 of the second structure 36. The vias are then lined with a liner material (e.g., TiN, TaN or WN) and the remaining portion of the vertical via holes is filled with a conductive material. FIG. 8D illustrates the final structure including the conductive filled vertical via holes 52. Conventional interconnect process can then be performed as desired.

In one embodiment of the present invention, the plurality of transistors 14 in the first structure 10' may have a 6T configuration, while the plurality of transistors 38 in the second structure 34 may have a 9T configuration. The 6T configuration typically forms the storage element of the inventive CAM cell, while the 9T configuration typically forms the compare elements of the inventive CAM cell. In another embodiment, the plurality of transistors 14 in the first structure 10' may have a 9T configuration, while the plurality of transistors 38 in the second structure 34 may have a 6T configuration.

As such, the method described above, provides a multi-wafer CAM cell including at least one compare element (or circuitry) located in a first structure which is vertically stacked on top of, or below, at least one storage element (or circuitry) located in a second structure, said at least one compare element and said at least one storage element are interconnected by at least one vertically conductive filled via hole. Preferably, the at least one compare element is located above the at least one storage element.

In further embodiments, other structures including, for example, other compare elements and/or storage elements can be vertically stacked on top of the structure shown in FIG. 8D.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of operating a multi-operational-mode multi-wafer device configured for operation in a first mode as a CAM cell and for operation in a second mode as a register, said method comprising:

providing a multi-operational-mode multi-wafer device comprising first semiconductor components and second semiconductor components, wherein said first semiconductor components are configured as a match circuitry and comprise at least one compare element and a first power distribution structure comprising first power wires located in a first dielectric material layer, and wherein said second semiconductor components are configured as a storage circuitry vertically stacked on top of, or below, said first semiconductor components, said second semiconductor components comprising at least one storage element and a second power distribution structure comprising second power wires located in a second-dielectric material layer, wherein said second power distribution structure overlies or underlies said first power distribution structure, and said first semiconductor components and said second semiconductor components are interconnected by at least one vertically conductive filled via hole, and said first power distribution structure does not contact said second power distribution structure;

operating a combination of said first semiconductor components and said second semiconductor components as said CAM cell in a first mode, wherein said first power distribution structure provides a first non-zero power supply voltage to said first semiconductor components during operation in said first mode; and operating said second semiconductor components as a register in a second mode, wherein said first power distribution structure turns off said match circuitry during operation in said second mode, and wherein said second power distribution structure provides a second non-zero power supply voltage to said second semiconductor components.

2. The method of claim 1, wherein said at least one compare element is located above said at least one storage element within said multi-operational-mode multi-wafer device.

3. The method of claim 1, wherein said at least one compare element comprises a plurality of first transistors that have a 9T configuration and said at least one storage element comprises a plurality of second transistors having a 6T configuration.

4. The method of claim 3, wherein said plurality of first transistors are located upon and within a top, active semiconductor layer of a first semiconductor-on-insulator substrate, and said plurality of said second transistors are located upon and within a top, active semiconductor layer of a second semiconductor-on-insulator substrate.

5. The method of claim 4, wherein said first and second semiconductor-on-insulator substrates each include a buried insulating layer directly beneath the top, active semiconductor layer.

6. The method of claim 1, wherein said at least one vertically conductive filled via hole is located within at least one dielectric material that is present within one of said first and second dielectric material layers.

7. The method of claim 1, wherein said first semiconductor components are embedded in a dielectric material that is present within one of said first and second dielectric material layers, and has conductive filled openings that are in contact with surfaces of at least one first transistor, and said second semiconductor components are embedded in another dielectric material that is present within another of said first and second dielectric material layers, and has conductive filled openings that are in contact with surfaces of at least one second transistor.

* * * * *